US009310686B2

(12) United States Patent
Yabu et al.

(10) Patent No.: US 9,310,686 B2
(45) Date of Patent: Apr. 12, 2016

(54) TARGET SUPPLY DEVICE AND TARGET SUPPLY METHOD

(71) Applicant: GIGAPHOTON INC., Oyama-shi, Tochigi (JP)

(72) Inventors: Takayuki Yabu, Oyama (JP); Tamotsu Abe, Oyama (JP)

(73) Assignee: GIGAPHOTON INC., Tochigi (JP)

( * ) Notice: Subject to any disclaimer, the term of this patent is extended or adjusted under 35 U.S.C. 154(b) by 322 days.

(21) Appl. No.: 13/953,350

(22) Filed: Jul. 29, 2013

(65) Prior Publication Data

US 2014/0034759 A1    Feb. 6, 2014

(30) Foreign Application Priority Data

Aug. 1, 2012  (JP) ................. 2012-171428

(51) Int. Cl.
*B05B 5/025* (2006.01)
*G03F 7/20* (2006.01)
*B05B 5/053* (2006.01)
*B05B 12/02* (2006.01)
*H05G 2/00* (2006.01)

(52) U.S. Cl.
CPC ............ *G03F 7/2004* (2013.01); *B05B 5/0255* (2013.01); *B05B 5/0531* (2013.01); *B05B 12/02* (2013.01); *G03F 7/70033* (2013.01); *H05G 2/003* (2013.01)

(58) Field of Classification Search
CPC .... B05B 5/0255; B05B 12/02; B05B 5/0531; H05G 2/003; G03F 7/2004; G03F 7/0033
USPC ........................ 239/3, 70, 104, 106, 690, 708; 250/493.1, 504 R
See application file for complete search history.

(56) References Cited

U.S. PATENT DOCUMENTS 7,405,416 B2    7/2008  Algots et al.
8,604,451 B2 *  12/2013  Yabu et al. ................ 250/504 R \* cited by examiner

*Primary Examiner* — Steven J Ganey
(74) *Attorney, Agent, or Firm* — Studebaker & Brackett PC

(57) ABSTRACT

A target supply method uses a target supply device that includes a target generation unit having a nozzle, a pressure control unit having a pressure sensor and an actuator, an electrode, a potential application unit, and a timer; further, the method include raising the pressure inside the target generation unit to a setting pressure by the actuator, applying different potentials to the electrode and a target material from each other by the potential application unit in the case where it is detected that the pressure inside the target generation unit is halfway raised to the setting pressure, and applying a constant first potential to the target material and a first pulse voltage to the electrode by the potential application unit to extract the target material with electrostatic force in the case where it is detected that the pressure inside the target generation unit has been raised to the setting pressure.

6 Claims, 10 Drawing Sheets

TARGET SUPPLY DEVICE AND TARGET SUPPLY METHOD

CROSS-REFERENCE TO A RELATED APPLICATION

The present application claims priority from Japanese Patent Application No. 2012-171428 filed Aug. 1, 2012.

BACKGROUND

1. Technical Field

The present disclosure relates to target supply devices and target supply methods.

2. Related Art

In recent years, semiconductor production processes have become capable of producing semiconductor devices with increasingly fine feature sizes, as photolithography has been making rapid progress toward finer fabrication. In the next generation of semiconductor production processes, microfabrication with feature sizes at 60 nm to 45 nm, and further, microfabrication with feature sizes of 32 nm or less will be required. In order to meet the demand for microfabrication with feature sizes of 32 nm or less, for example, an exposure apparatus is needed in which a system for generating EUV light at a wavelength of approximately 13 nm is combined with a reduced projection reflective optical system.

Three kinds of systems for generating EUV light are known in general, which include a Laser Produced Plasma (LPP) type system in which plasma is generated by irradiating a target material with a laser beam, a Discharge Produced Plasma (DPP) type system in which plasma is generated by electric discharge, and a Synchrotron Radiation (SR) type system in which orbital radiation is used to generate plasma.

SUMMARY

A target supply method according to an aspect of the present disclosure may use a target supply device including a target generation unit which has a nozzle and is configured to accommodate a target material therein, a pressure control unit which has a pressure sensor configured to detect a pressure inside the target generation unit and has an actuator configured to control the pressure inside the target generation unit, an electrode configured to extract the target material through a nozzle hole of the nozzle with electrostatic force, a potential application unit configured to apply a potential to the electrode and the target material inside the target generation unit, and a timer; further, the target supply method may include raising the pressure inside the target generation unit to a setting pressure by the actuator based on a detection result of the pressure inside the target generation unit detected by the pressure sensor, applying different potentials to the electrode and the target material from each other by the potential application unit in the case where it is detected based on a time of the timer that the pressure inside the target generation unit is halfway raised to the setting pressure, and applying a constant first potential to the target material and a first pulse voltage to the electrode by the potential application unit in order to extract the target material with the electrostatic force in the case where it is detected based on the detection result by the pressure sensor that the pressure inside the target generation unit has been raised to the setting pressure.

A target supply device according to an aspect of the present disclosure may include a target generation unit that has a nozzle and is configured to accommodate a target material therein, a pressure control unit that has a pressure sensor configured to detect a pressure inside the target generation unit and has an actuator configured to control the pressure inside the target generation unit, an electrode configured to extract the target material through a nozzle hole of the nozzle with electrostatic force, a potential application unit configured to apply a potential to the electrode and the target material inside the target generation unit, a timer, and a controlling unit configured to control the pressure control unit and the potential application unit based on a detection result of the pressure inside the target generation unit detected by the pressure sensor and a time of the timer; in the target supply device, the controlling unit may perform raising the pressure inside the target generation unit to a setting pressure, applying different potentials to the electrode and the target material from each other in the case where it is detected that the pressure inside the target generation unit is halfway raised to the setting pressure, and applying a constant first potential to the target material and a first pulse voltage to the electrode in order to extract the target material with the electrostatic force in the case where it is detected that the pressure inside the target generation unit has been raised to the setting pressure.

BRIEF DESCRIPTION OF THE DRAWINGS

Hereinafter, selected embodiments of the present disclosure will be described with reference to the accompanying drawings.

DETAILED DESCRIPTION

Figure 1:
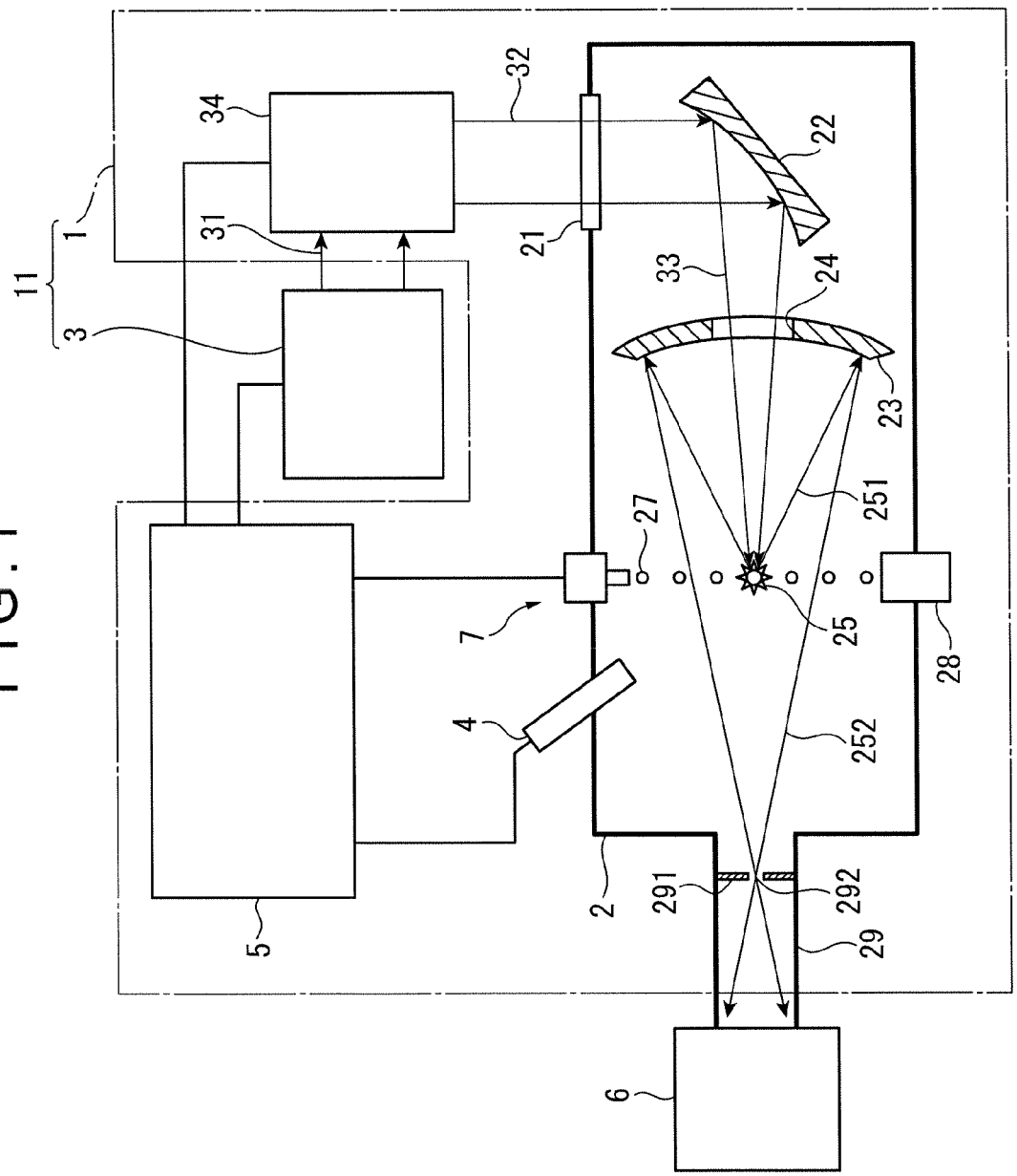
FIG. 1 is a diagram schematically illustrating an exemplary configuration of an LPP type EUV light generation system.

Hereinafter, selected embodiments of the present disclosure will be described in detail with reference to the accompanying drawings. The embodiments to be described below are merely illustrative in nature and do not limit the scope of the present disclosure. Further, the configuration(s) and operation(s) described in each embodiment are not all essential in implementing the present disclosure. Note that like elements are referenced by like reference numerals and characters, and duplicate descriptions thereof will be omitted herein.

Contents

1. Overview
2. Overview of EUV Light Generation System
2.1 Configuration
2.2 Operation
3. EUV Light Generation System Including Target Supply Device
3.1 First Embodiment
3.1.1 Outline
3.1.2 Configuration
3.1.3 Operation
3.2 Second Embodiment
3.2.1 Outline
3.2.2 Configuration
3.2.3 Operation
3.3 Variation 1. Overview A target supply method according to an embodiment of the present disclosure may use a target supply device including a target generation unit that has a nozzle and is configured to accommodate a target material therein, a pressure control unit that has a pressure sensor configured to detect a pressure inside the target generation unit and has an actuator configured to control the pressure inside the target generation unit, an electrode configured to extract the target material through a nozzle hole of the nozzle with electrostatic force, a potential application unit configured to apply a potential to the electrode and the target material inside the target generation unit, and a timer; further, the target supply method may include raising the pressure inside the target generation unit to a setting pressure by the actuator based on a detection result of the pressure inside the target generation unit detected by the pressure sensor, applying different potentials to the electrode and the target material from each other by the potential application unit in the case where it is detected based on a time of the timer that the pressure inside the target generation unit is halfway raised to the setting pressure, and applying a constant first potential to the target material and a first pulse voltage to the electrode by the potential application unit in order to extract the target material with the electrostatic force in the case where it is detected based on the detection result by the detection sensor that the pressure inside the target generation unit has been raised to the setting pressure.

A target supply device according to an embodiment of the present disclosure may include a target generation unit that has a nozzle and is configured to accommodate a target material therein, a pressure control unit that has a pressure sensor configured to detect a pressure inside the target generation unit and has an actuator configured to control the pressure inside the target generation unit, an electrode configured to extract the target material through a nozzle hole of the nozzle with electrostatic force, a potential application unit configured to apply a potential to the electrode and the target material inside the target generation unit, a timer, and a controlling unit configured to control the pressure control unit and the potential application unit based on a detection result of the pressure inside the target generation unit detected by the pressure sensor and a time of the timer; in the target supply device, the controlling unit may perform raising the pressure inside the target generation unit to a setting pressure, applying different potentials to the electrode and the target material from each other in the case where it is detected that the pressure inside the target generation unit is halfway raised to the setting pressure, and applying a constant first potential to the target material and a first pulse voltage to the electrode in order to extract the target material with the electrostatic force in the case where it is detected that the pressure inside the target generation unit has been raised to the setting pressure.

2. Overview of EUV Light Generation System 2.1 Configuration

FIG. 1 schematically illustrates an exemplary configuration of an LPP type EUV light generation system. An EUV light generation apparatus 1 may be used with at least one laser apparatus 3. Hereinafter, a system that includes the EUV light generation apparatus 1 and the laser apparatus 3 may be referred to as an EUV light generation system 11. As shown in FIG. 1 and described in detail below, the EUV light generation system 11 may include a chamber 2 and a target supply device 7. The chamber 2 may be sealed airtight. The target supply device 7 may be mounted onto the chamber 2, for example, to penetrate a wall of the chamber 2. A target material to be supplied by the target supply device 7 may include, but is not limited to, tin, terbium, gadolinium, lithium, xenon, or any combination thereof.

The chamber 2 may have at least one through-hole or opening formed in its wall, and a pulse laser beam 32 may travel through the through-hole/opening into the chamber 2. Alternatively, the chamber 2 may have a window 21, through which the pulse laser beam 32 may travel into the chamber 2. An EUV collector mirror 23 having a spheroidal surface may, for example, be provided in the chamber 2. The EUV collector mirror 23 may have a multi-layered reflective film formed on the spheroidal surface thereof. The reflective film may include a molybdenum layer and a silicon layer, which are alternately laminated. The EUV collector mirror 23 may have a first focus and a second focus, and may be positioned such that the first focus lies in a plasma generation region 25 and the second focus lies in an intermediate focus (IF) region 292 defined by the specifications of an external apparatus, such as an exposure apparatus 6. The EUV collector mirror 23 may have a through-hole 24 formed at the center thereof so that a pulse laser beam 33 may travel through the through-hole 24 toward the plasma generation region 25.

The EUV light generation system 11 may further include an EUV light generation controller 5 and a target sensor 4. The target sensor 4 may have an imaging function and detect at least one of the presence, trajectory, position, and speed of a target 27.

Further, the EUV light generation system 11 may include a connection part 29 for allowing the interior of the chamber 2 to be in communication with the interior of the exposure apparatus 6. A wall 291 having an aperture 293 may be provided in the connection part 29. The wall 291 may be positioned such that the second focus of the EUV collector mirror 23 lies in the aperture 293 formed in the wall 291.

The EUV light generation system 11 may also include a laser beam direction control unit 34, a laser beam focusing mirror 22, and a target collector 28 for collecting targets 27. The laser beam direction control unit 34 may include an optical element (not separately shown) for defining the direction into which the pulse laser beam 32 travels and an actuator (not separately shown) for adjusting the position and the orientation or posture of the optical element.

2.2 Operation

With continued reference to FIG. 1, a pulse laser beam 31 outputted from the laser apparatus 3 may pass through the laser beam direction control unit 34 and be outputted therefrom as the pulse laser beam 32 after having its direction optionally adjusted. The pulse laser beam 32 may travel through the window 21 and enter the chamber 2. The pulse laser beam 32 may travel inside the chamber 2 along at least one beam path from the laser apparatus 3, be reflected by the laser beam focusing mirror 22, and strike at least one target 27 as a pulse laser beam 33.

The target supply device 7 may be configured to output the target(s) 27 toward the plasma generation region 25 in the chamber 2. The target 27 may be irradiated with at least one pulse of the pulse laser beam 33. Upon being irradiated with the pulse laser beam 33, the target 27 may be turned into plasma, and rays of light 251 including EUV light may be emitted from the plasma. At least the EUV light included in the light 251 may be reflected selectively by the EUV collector mirror 23. EUV light 252, which is the light reflected by the EUV collector mirror 23, may travel through the intermediate focus region 292 and be outputted to the exposure apparatus 6. Here, the target 27 may be irradiated with multiple pulses included in the pulse laser beam 33.

The EUV light generation controller 5 may be configured to integrally control the EUV light generation system 11. The EUV light generation controller 5 may be configured to process image data of the target 27 captured by the target sensor 4. Further, the EUV light generation controller 5 may be configured to control at least one of: the timing when the target 27 is outputted and the direction into which the target 27 is outputted. Furthermore, the EUV light generation controller 5 may be configured to control at least one of: the timing when the laser apparatus 3 oscillates, the direction in which the pulse laser beam 33 travels, and the position at which the pulse laser beam 33 is focused. It will be appreciated that the various controls mentioned above are merely examples, and other controls may be added as necessary.

3. EUV Light Generation System Including Target Supply Device

3.1 First Embodiment

3.1.1 Outline

In a target supply method according to a first embodiment of the present disclosure, in the case where it is detected that the pressure inside the target generation unit is halfway raised to a setting pressure, applying of different potentials to the electrode and the target material from each other by the potential application unit may be performed by the potential application unit applying a constant second potential which is the same as or different from the first potential to the target material and also applying a second pulse voltage which is the same as or different from the first pulse voltage to the electrode from a time before raising of the pressure toward the setting pressure is started until a time at which the pressure has been raised to the setting pressure.

In a target supply device according to the first embodiment of the present disclosure, if it is detected that the pressure inside the target generation unit is halfway raised to the setting pressure, the controlling unit may perform applying of different potentials to the electrode and the target material from each other through applying the constant second potential which is the same as or different from the first potential to the target material and also applying the second pulse voltage which is the same as or different from the first pulse voltage to the electrode in the case where the controlling unit detects that the raising of the pressure toward the setting pressure is before being started and that the pressure is before being raised up to the setting pressure.

3.1.2 Configuration

Figure 2:
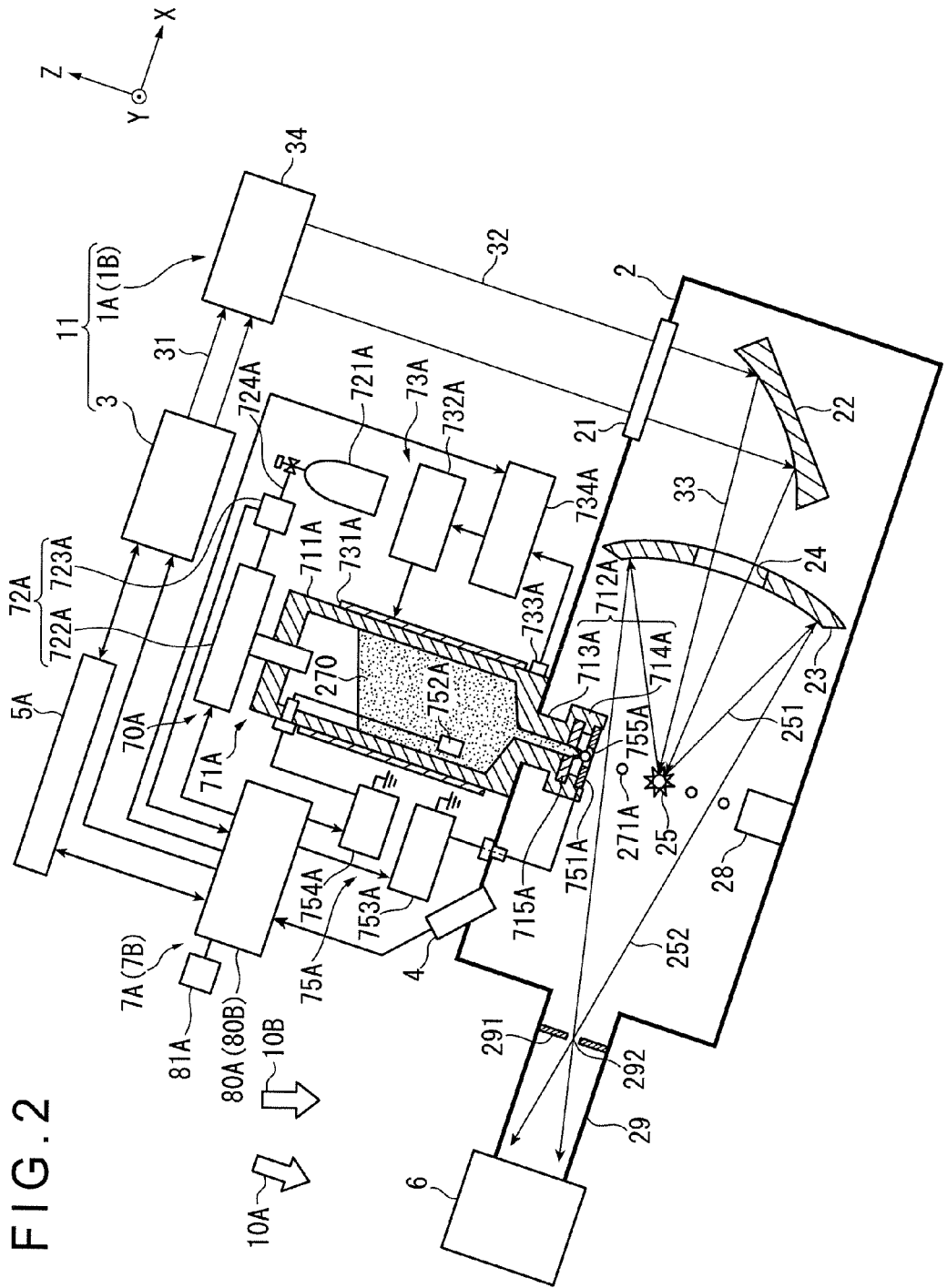
FIG. 2 is a diagram schematically illustrating a configuration of an EUV light generation system including a target supply device according to a first embodiment or a second embodiment.

FIG. 2 is a diagram schematically illustrating a configuration of an EUV light generation system including a target supply device according to the first embodiment or a target supply device according to a second embodiment which will be explained later.

An EUV light generation apparatus 1A may include, as shown in FIG. 2, the chamber 2 and a target supply device 7A. The target supply device 7A may include a target generation section 70A, a target control unit 80A as a controlling unit, and a timer 81A. The laser apparatus 3 and an EUV light generation controller 5A may be electrically connected with the target control unit 80A.

The target generation section 70A may include a target generation unit 71A, a pressure control unit 72A, a temperature adjustment section 73A, and an electrostatic extraction section 75A.

The target generation unit 71A may include a tank 711A configured to store a target material 270 therein. The tank 711A may be cylindrically shaped. The tank 711A may be provided with a nozzle 712A configured to output the target material 270 stored in the tank 711A into the chamber 2 as a target 271A. The target generation unit 71A may be provided in a manner in which the tank 711A is located outside of the chamber 2 while the nozzle 712A is located inside the chamber 2. The pressure control unit 72A may be connected with the tank 711A.

Depending on installation conditions of the chamber 2, it is not always the case that a previously-set output direction of the target 271A (axial direction of the nozzle 712A (called a set output direction 10A)) is the same in direction as the gravitational direction 10B. The system may be so configured as to output the target 271A in a slant or horizontal direction relative to the gravitational direction 10B. Note that in the first embodiment, the chamber 2 may be installed so that the set output direction 10A of the target 271A is slanted relative to the gravitational direction 10B.

The nozzle 712A may include a main nozzle body 713A, a holding portion 714A, and an output portion 715A. The main nozzle body 713A may be provided sticking out into the chamber 2 from the lower surface of the tank 711A. The holding portion 714A may be provided on a leading end of the main nozzle body 713A. The holding portion 714A may be formed in a cylindrical shape with a larger diameter than that of the main nozzle body 713A.

The output portion 715A may be formed approximately in a disc shape. The output portion 715A may be held by the holding portion 714A so as to adhere to the leading end surface of the main nozzle body 713A. A projection 716A formed in a circular truncated cone shape may be provided at the center of the output portion 715A (see FIG. 5A). The output portion 715A may be so provided as to make the projection 716A stick out into the chamber 2. The projection 716A may be provided so that an electric field is likely to be concentrated thereby. A nozzle hole 718A (see FIG. 5A) that is opened approximately at the center of a leading end portion constituting the upper surface of the circular truncated cone of the projection 716A, may be provided in the projection 716A. The diameter of the nozzle hole 718A may be 6 to 15 µm. It is preferable for the output portion 715A to be made of a material that makes an angle of contact between the output portion 715A and the target material 270 greater than 90 degrees. Alternatively, at least the surface of the output portion 715A may be coated with a material that makes the above-mentioned angle of contact greater than 90 degrees. Materials that make the angle of contact greater than 90 degrees may include SiC, $SiO_2$, $Al_2O_2$, molybdenum, and tungsten.

The tank 711A, the nozzle 712A, and the output portion 715A may be made of an electrical insulating material. In the case where these elements are made of a non-electrical insulating material, for example, a metal material such as molybdenum or the like, an electrical insulating material may be disposed between the chamber 2 and the target generation unit 71A, between the output portion 715A and a first electrode 751A which will be explained later, and so on. In this case, the tank 711A and a pulse voltage generation unit 753A which will be explained later may be electrically connected with each other.

The pressure control unit 72A may include an actuator 722A and a pressure sensor 723A. The actuator 722A may be connected with an inert gas cylinder 721A via a pipe 724A. The actuator 722A may be electrically connected with the target control unit 80A. The actuator 722A may be so configured as to control the pressure of an inert gas supplied from the inert gas cylinder 721A and adjust the pressure inside the tank 711A based on a signal sent from the target control unit 80A.

The pressure sensor 723A may be provided on the pipe 724A. The pressure sensor 723A may be electrically connected with the target control unit 80A. The pressure sensor 723A may detect the pressure of the inert gas present in the pipe 724A and send a signal corresponding to the detected pressure to the target control unit 80A.

The temperature adjustment section 73A may be so configured as to adjust the temperature of the target material 270 stored in the tank 711A. The temperature adjustment section 73A may include a heater 731A, a heater power source 732A, a temperature sensor 733A, and a temperature controller 734A. The heater 731A may be provided on an outer circumferential surface of the tank 711A. The heater power source 732A may be electrically connected with the heater 731A and the temperature controller 734A. The heater power source 732A may supply the heater 731A with electric power so as to cause the heater 731A to generate heat based on a signal from the temperature controller 734A. This makes it possible to heat the target material 270 stored in the tank 711A via the tank 711A.

The temperature sensor 733A may be provided at the nozzle 712A side on the outer circumferential surface of the tank 711A or may be provided inside the tank 711A. The temperature sensor 733A may be electrically connected with the temperature controller 734A. The temperature sensor 733A may be so configured as to detect the temperature of the tank 711A and send a signal corresponding to the detected temperature to the temperature controller 734A. The temperature of the tank 711A can be approximately the same as that of the target material 270. The temperature controller 734A may be electrically connected with the target control unit 80A. The temperature controller 734A may be so configured as to output a signal to the heater power source 732A for adjusting the temperature of the target material 270 to a predetermined temperature based on the signal from the temperature sensor 733A.

The electrostatic extraction section 75A may include the first electrode 751A, a second electrode 752A, the pulse voltage generation unit 753A, and a voltage source 754A. As will be explained later, the target 271A may be extracted from the output portion 715A by making use of a potential difference between the potential of the first electrode 751A and the potential of the second electrode 752A.

The second electrode 752A may be disposed within the target material 270 stored in the tank 711A. The voltage source 754A may be electrically connected with the second electrode 752A via a feed-through.

The pulse voltage generation unit 753A and the voltage source 754A may be a potential application unit of the present disclosure. The pulse voltage generation unit 753A and the voltage source 754A may be grounded. The pulse voltage generation unit 753A and the voltage source 754A may be electrically connected with the target control unit 80A.

The timer 81A may be electrically connected with the target control unit 80A. The timer 81A may measure time and send a signal corresponding to the measured time to the target control unit 80A. The timer 81A may be a watch for reading current time or a stopwatch for measuring an amount of elapsed time since the start of operation of the timer 81A.

The target control unit 80A may be a controlling unit. The target control unit 80A may send a signal to the temperature controller 734A so as to control the temperature of the target material 270 in the target generation unit 71A. The target control unit 80A may send a signal to the actuator 722A so as to control the pressure inside the target generation unit 71A. The target control unit 80A may send signals respectively to the pulse voltage generation unit 753A and the voltage source 754A so as to control the potentials to be applied to the first electrode 751A and the second electrode 752A.

3.1.3 Operation

Figure 3:
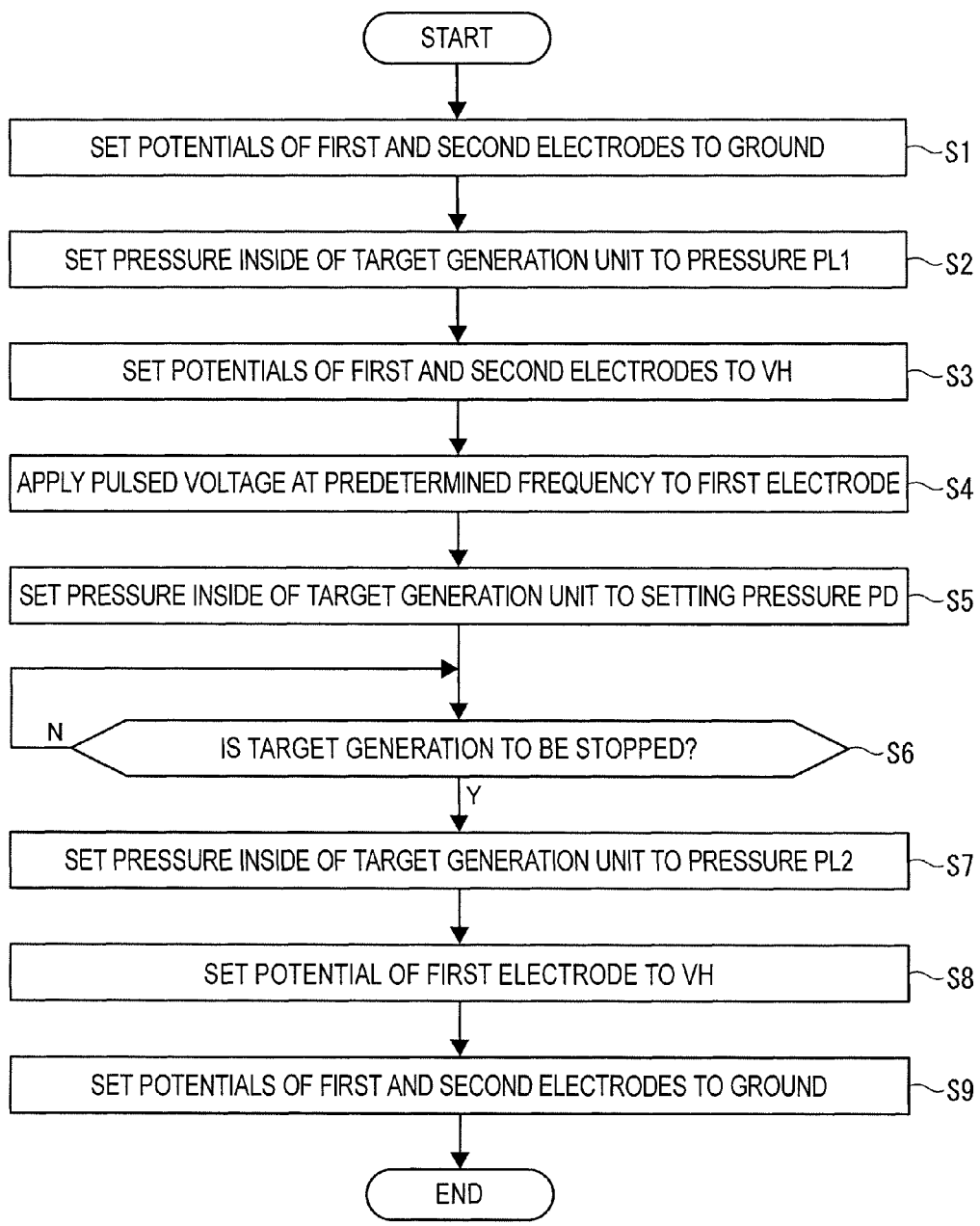
FIG. 3 is a flowchart illustrating a target supply method according to the first embodiment.
Figure 4:
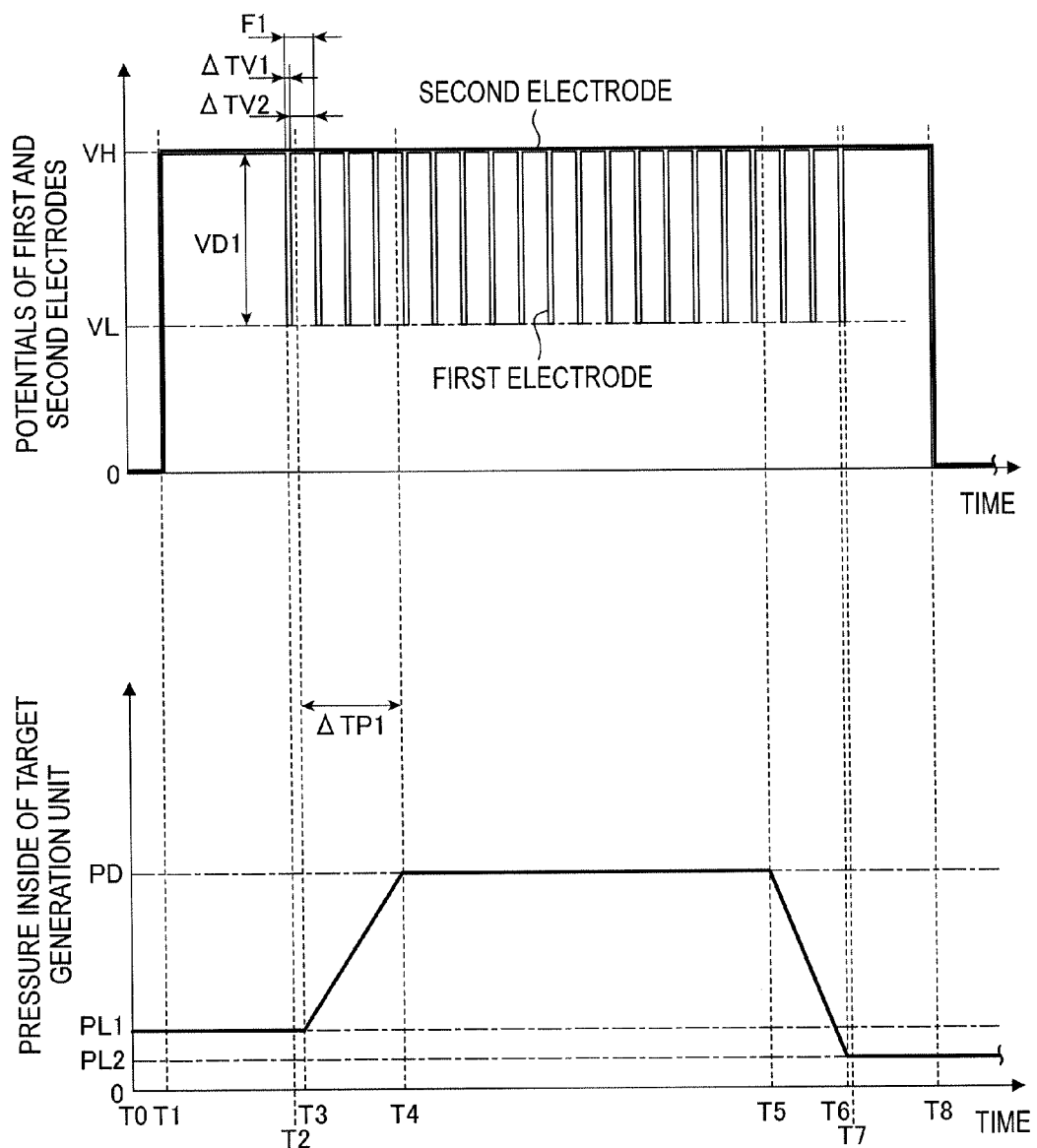
FIG. 4 is a timing chart illustrating the target supply method according to the first embodiment.
Figure 5A:
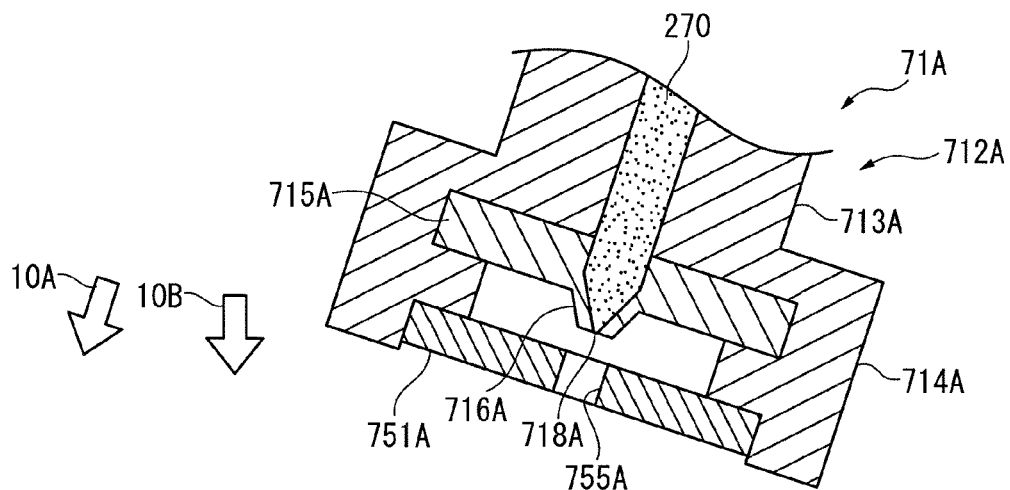
FIG. 5A is a diagram illustrating a state before a target is extracted according to the first embodiment.
Figure 5B:
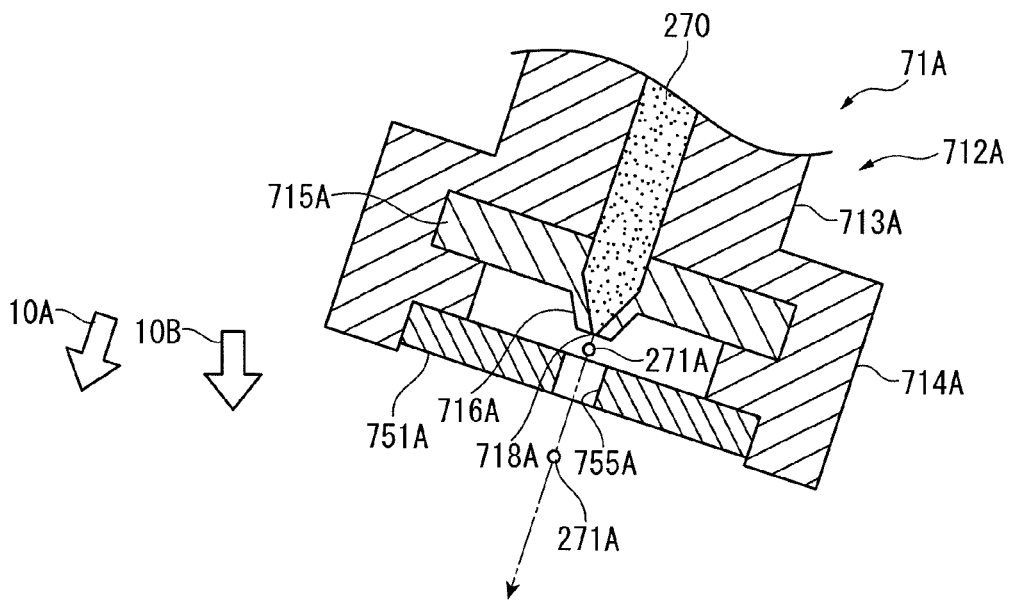
FIG. 5B is a diagram illustrating a state in which the target supply device is in operation according to the first embodiment.

FIG. 3 is a flowchart illustrating the target supply method. FIG. 4 is a timing chart illustrating the target supply method. FIG. 5A is a diagram illustrating a state before a target is extracted. FIG. 5B is a diagram illustrating a state in which the target supply device is in operation.

In the operation described hereinafter, the target control unit 80A may receive a signal sent from the pressure sensor 723A and determine the pressure inside the target generation unit 71A based on the received signal. The target control unit 80A may receive a signal sent from the timer 81A and determine time based on the received signal.

The EUV light generation controller 5A may send a target output signal to the target control unit 80A of the target supply device 7A. At this time, the pressure inside the target generation unit 71A may be at the atmospheric pressure.

The target control unit 80A, upon receiving the target output signal from the EUV light generation controller 5A, may send signals to the pulse voltage generation unit 753A and the voltage source 754A so as to set the potentials of the first electrode 751A and the second electrode 752A to the ground (0 V) as shown in FIG. 3 (step S1).

The target control unit 80A may send a signal to the temperature controller 734A to control the heater power source 732A so that the temperature of the target material 270 in the target generation unit 71A becomes higher than the melting point of the target material 270.

In the case where the target control unit 80A determines that a temperature detected by the temperature sensor 733A is higher than the melting point of the target material 270 and is stable, the target control unit 80A may set the pressure inside the target generation unit 71A to a pressure PL1 (step S2). Here, in the case where the temperature detected by the temperature sensor 733A falls within a predetermined range of temperature in which a predetermined temperature that is higher than the above-mentioned melting point is centered, and if a predetermine period of time in which the temperature is maintained within the above predetermined range of temperature has passed, it may be determined that the temperature detected by the temperature sensor 733A is stable at a temperature higher than the melting point of the target material 270. The setting of pressure inside the target generation unit 71A to the pressure PL1 may be performed by the target control unit 80A sending a signal to the actuator 722A to control the pressure of the inert gas supplied from the inert gas cylinder 721A. With the process described above, as shown in FIG. 4, at time T0, the respective potentials of the first electrode 751A and the second electrode 752A can be set to the ground and the pressure inside the target generation unit 71A can become the pressure PL1. Magnitude of the pressure PL1 may be set so that the target material 270 reaches the nozzle hole 718A and is not separated as the target 271A, as shown in FIG. 5A. The pressure PL1 may be 100 kPa, for example.

As shown in FIG. 3, the target control unit 80A may send signals to the pulse voltage generation unit 753A and the voltage source 754A, and set the respective potentials of the first electrode 751A and the second electrode 752A to a potential VH at time T1 (step S3). The potential VH may be 5 kV. The potential VH set to the second electrode 752A in step S3 may be the constant first potential applied to the target material 270 in the present disclosure. With the process of step S3, the potentials of the first electrode 751A and the second electrode 752A can be raised to the potential VH at time T1, as shown in FIG. 4.

As shown in FIGS. 3 and 4, the target control unit 80A may send a signal to the pulse voltage generation unit 753A and apply a pulsed voltage at a predetermined frequency to the first electrode 751A at time T2 (step S4). The pulsed voltage to be applied in step S4 may be the first pulse voltage in the present disclosure. The maximum value of a pulsed potential may be the potential VH. The minimum value of the pulsed potential may be a potential VL. The potential VL may be the second potential in the present disclosure. Magnitude of the potential VL may be set so that the target 271A can be extracted from the output portion 715A with a potential difference between the first electrode 751A and the second electrode 752A (VD1=VH−VL). A first time ΔTV1 during which the potential difference VD1 is continuously generated by maintaining the potential of the first electrode 751A at the potential VL may be shorter than a time ΔTP1 from time T3 to time T4 required for pressure rising, which will be explained later. A cycle F1 of the pulsed voltage may be shorter than the time ΔTP1 required for pressure rising. The frequency of the pulsed voltage may be 50 kHz to 100 kHz.

At this time, since the potential difference VD1 is generated between the first electrode 751A and the second electrode 752A, the target 271A can be extracted from the nozzle 712A. However, because the pressure inside the target generation unit 71A is at the pressure PL1, a state in which the target material 270 is not outputted through the nozzle hole 718A can be continued as shown in FIG. 5A.

As shown in FIG. 3, the target control unit 80A may send a signal to the actuator 722A and set the pressure inside the target generation unit 71A to a setting pressure PD at time T3 (step S5). The setting of pressure inside the target generation unit 71A in step S5 may be performed in the same manner as in step S2. The setting pressure PD may be the setting pressure in the present disclosure. Magnitude of the setting pressure PD may be set so that the target material 270 is separated and the target 271A is extracted through the nozzle hole 718A. The setting pressure PD may be 0.5 MPa to 1 MPa, for example.

With the process of step 5, the pressure inside the target generation unit 71A can gradually rise and reach the setting pressure PD at time T4, as shown in FIG. 4. Further, during the time ΔTP1 required for pressure rising, that is, during the time in which the pressure inside the target generation unit 71A rises from the pressure PL1 halfway to the setting pressure PD, it is possible to apply a constant potential to the second electrode 752A and to apply a pulsed voltage to the first electrode 751A. With this, the target material 270 can be pushed out through the opening surface of the nozzle hole 718A by the pressure inside the target generation unit 71A and the pushed-out portion can gradually grow larger to form the target 271A during a period of time in which the potential of the first electrode 751A and the potential of the second electrode 752A are at the same potential of VH. When the potential of the first electrode 751A drops to the potential VL, the potential difference VD1 between the first electrode 751A and the second electrode 752A is generated. The potential difference VD1 can cause the target 271A to be extracted from the output portion 715A as shown in FIG. 5B.

Note that, as described above, since the cycle F1 is shorter than the time ΔTP1 required for pressure raising, the target 271A can be outputted at least once during the time ΔTP1 required for pressure rising.

After time T4, the pressure inside the target generation unit 71A can be maintained at the setting pressure PD. In addition, the constant potential VH can be continuously applied to the second electrode 752A and the pulsed voltage with the cycle F1 can be continuously applied to the first electrode 751A.

As a result, during a second time ΔTV2 in which both the potential of the first electrode 751A and the potential of the second electrode 752A are at the potential VH, the target 271A can be formed on the leading end of the projection 716A. Then, during the first time ΔTV1 in which the potential difference VD1 is generated between the first electrode 751A and the second electrode 752A, the target 271A can be outputted.

The target control unit 80A may determine whether to stop the generation of the target 271A or not (step S6). Upon receiving a target output stop signal from the EUV light generation controller 5A, the target control unit 80A may determine to stop the generation of the target 271A.

If the target control unit 80A determines not to stop the generation of the target 271A in step S6, the process of step S6 may be carried out again after a predetermined amount of time has passed. On the other hand, if the target control unit 80A determines to stop the generation of the target 271A in step S6, the target control unit 80A may send a signal to the actuator 722A so as to set the pressure inside the target generation unit 71A to a pressure PL2 (step S7). With the process of step S7, during a period from time T5 to time T6, the pressure inside the target generation unit 71A can drop from the setting pressure PD to the pressure PL2, as shown in FIG. 4. Magnitude of the pressure PL2 may be set so that the target material 270 reaches the nozzle hole 718A and is not separated as the target 271A. The magnitude of the pressure PL2 may be less than, equal to, or greater than that of the pressure PL1.

Note that, at the latest, the generation of the target 271A can be stopped after time T6 at which the pressure inside the target generation unit 71A has reached the pressure PL2.

As shown in FIG. 3, the target control unit 80A may set the potential of the first electrode 751A to the potential VH (step S8). With the process of step S8, during a period from time T7 to time T8, both the potential of the first electrode 751A and the potential of the second electrode 752A can be maintained at the potential VH, as shown in FIG. 4. Thereafter, the target control unit 80A may set the potentials of the first electrode 751A and second electrode 752A to the ground (step S9) and may end the process. With the process of step S9, the potentials of the first electrode 751A and second electrode 752A can be maintained at the ground after time T8.

As described thus far, the target control unit 80A of the target supply device 7A may apply the potential VH to the second electrode 752A in a state in which the pressure inside the target generation unit 71A is at the pressure PL1. The target control unit 80A may apply a pulsed voltage, whose maximum value is the potential VH and minimum value is the potential VL, to the first electrode 751A while the potential VH is being applied to the second electrode 752A. The target control unit 80A may raise the pressure inside the target generation unit 71A up to the setting pressure PD while the pulsed voltage is being applied to the first electrode 751A. In other words, the target supply device 7A may apply the potential VL to the first electrode 751A and also apply the potential VH higher than the potential VL to the second electrode 752A during the time ΔTP1 required for pressure rising. After the pressure inside the target generation unit 71A has risen up to the setting pressure PD, the target supply device 7A may apply the constant potential VH to the second electrode 752A and also apply the pulsed voltage to the first electrode 751A.

Figure 6:
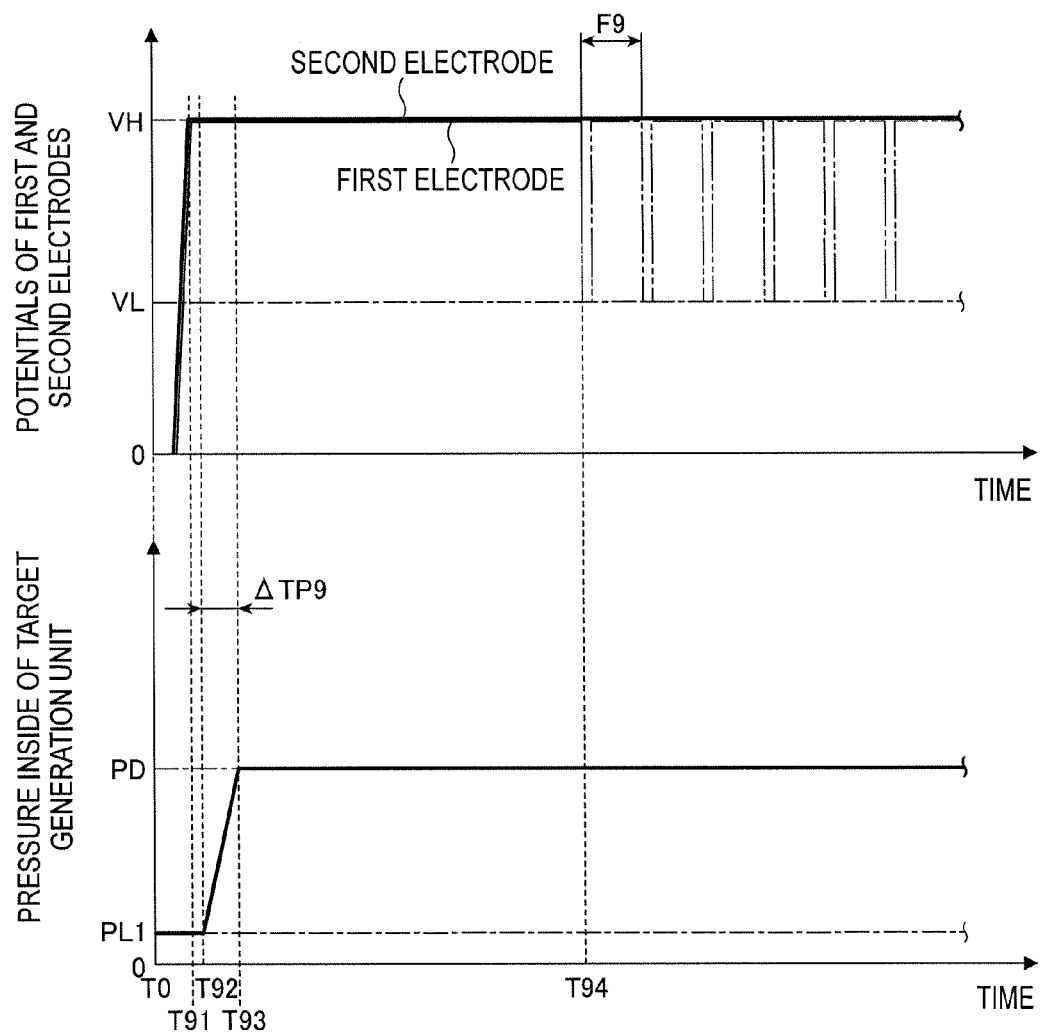
FIG. 6 is a timing chart illustrating a target supply method having a problem.
Figure 7:
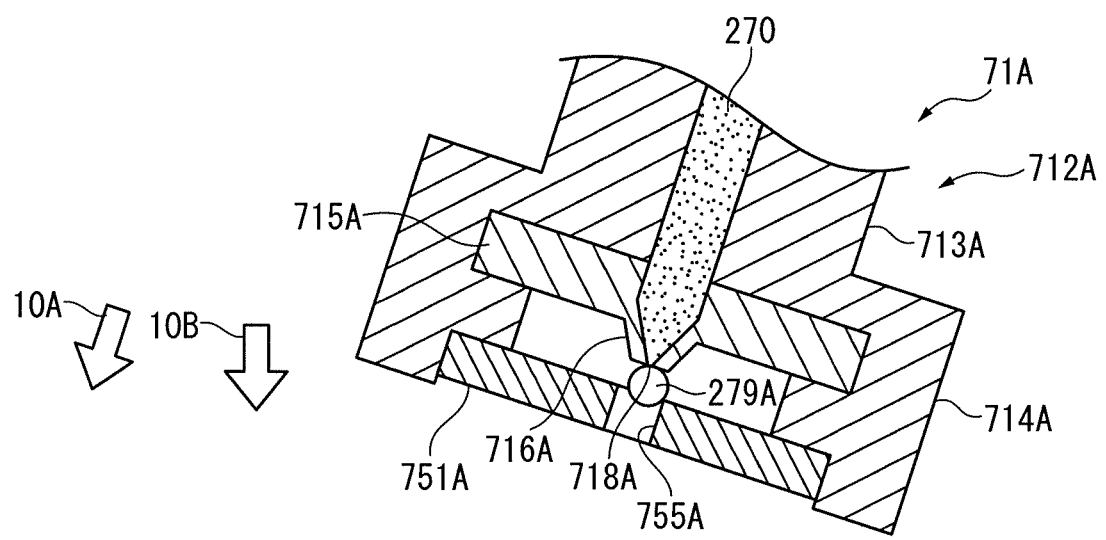
FIG. 7 is a diagram that schematically indicates the problem while illustrating a state in which a target makes contact with a first electrode.

It can be considered to perform control processing as illustrated in FIG. 6 during the generation of targets. FIG. 6 is a timing chart illustrating a target supply method having a problem. FIG. 7 is a diagram that schematically indicates the problem while illustrating a state in which a target makes contact with the first electrode.

That is, the target control unit may ground the potential of the first electrode 751A and the potential of the second electrode 752A and set the pressure inside the target generation unit 71A to the pressure PL1 at time T0. The target control unit may set the potentials of the first electrode 751A and second electrode 752A to the potential VH at time T91. The target control unit may raise the pressure inside the target generation unit 71A from the pressure PL1 to the setting pressure PD during a period from time T92 to time T93. The target control unit may maintain the pressure inside the target generation unit 71A at the setting pressure PD after time T93 at which the pressure inside the target generation unit 71A has been raised to the setting pressure PD.

During a period from time T92 to time T94, since the pressure inside the target generation unit 71A is at the setting pressure PD, the target material 270 can be pushed out through the opening surface of the nozzle hole 718A and the pushed-out portion can gradually grow larger. However, because a difference in potential between the first electrode 751A and the second electrode 752A is not generated at this time, the target material 270 is not separated to be extracted as the target 271A from the nozzle 712A. Moreover, unlike the first embodiment, since a potential difference is not generated between the first electrode 751A and the second electrode 752A during a time ΔTP9 from time T92 to time T93 required for pressure rising, the amount of target material 270 that is pushed out through the nozzle hole 718A can be larger than that in the first embodiment.

Consequently, as shown in FIG. 7, a target 279A that is larger than the target 271A can be formed on the leading end of the projection 716A. In the case where the set output direction 10A of the target 279A is slanted relative to the gravitational direction 10B, the target 279A can make contact with the first electrode 751A to short-circuit the target material 270 and the first electrode 751A.

At time T94 while the pressure inside the target generation unit 71A being maintained at the setting pressure PD, the target control unit may control the pulse voltage generation unit 753A to apply a pulsed voltage with a cycle F9 to the first electrode 751A in order to output the target 279A. At this time, since the first electrode 751A and the second electrode 752A can be short-circuited, the pulsed voltage cannot possibly be applied to the first electrode 751A as indicated by a double-dot dash line in FIG. 6. As a result, it is possible for the target 279A not to be outputted.

In contrast, in the first embodiment, during the time ΔTP1 required for pressure rising, the potential difference VD1 can be generated between the first electrode 751A and the second electrode 752A. With this, the target supply device 7A can output the target 271A at least once within the time ΔTP1 required for pressure rising. Accordingly, even if the set output direction 10A of the target 271A is slanted relative to the gravitational direction 10B, it is possible to prevent the target material 270 and the first electrode 751A from being short-circuited due to the target 271A adhering to the leading end of the projection 716A making contact with the first electrode 751A, at time T4 at which the pressure inside the target generation unit 71A has reached the setting pressure PD. This makes it possible for the target supply device 7A to appropriately output the target 271A.

The target control unit 80A of the target supply device 7A may apply the pulsed voltage with the cycle F1 to the first electrode 751A before time T3 from which it is started to raise the pressure inside the target generation unit 71A.

Accordingly, even if it is not clear that the elapsed time in which the pressure inside the target generation unit 71A is actually raised after the pressure control unit 72A has started the operation of raising the pressure, the target supply device 7A can output the target 271A at least once within the time ΔTP1 required for pressure rising.

In the first embodiment, the pulsed voltage with the same cycle F1 is applied to the first electrode 751A both before and after time T4, that is, the first pulse voltage and the second pulse voltage of the present disclosure are the same. However, a pulsed voltage with a different cycle from that of the pulsed voltage applied before time T4, may be applied as the second pulse voltage to the first electrode 751A after time T4.

Moreover, in the first embodiment, the potential VH with the same magnitude is applied to the second electrode 752A both before and after time T4, that is, the first potential and the second potential of the present disclosure have the same magnitude. However, the second potential to be applied to the second electrode 752A before time T4 may not be the potential VH if a potential difference can be generated between the first electrode 751A and the second electrode 752A before time T4.

3.2 Second Embodiment 3.2.1 Outline

In a target supply method according to a second embodiment of the present disclosure, if it is detected that the pressure inside the target generation unit is halfway raised to a setting pressure, applying of different potentials to the electrode and the target material from each other by the potential application unit may be performed by the potential application unit applying a constant second potential which is the same as or different from the first potential to the target material and also applying a constant third potential which is lower than the second potential to the electrode from time before the raising of the pressure toward the setting pressure is started until time when the pressure has been raised up to the setting pressure.

In a target supply device according to the second embodiment of the present disclosure, in the case where the controlling unit detects that the pressure inside the target generation unit is halfway raised to the setting pressure, the controlling unit may apply different potentials to the electrode and the target material from each other through applying the constant second potential which is the same as or different from the first potential to the target material and also applying the constant third potential which is lower than the second potential to the electrode if the controlling unit detects that the raising of the pressure toward the setting pressure is before being started and further that the pressure is before being raised up to the setting pressure.

3.2.2 Configuration

In an EUV light generation apparatus 1B according to the second embodiment, as shown in FIG. 2, aside from a target control unit 80B serving as a controlling unit of a target supply device 7B, the same elements as those of the EUV light generation apparatus 1A of the first embodiment may be applied in the configuration of the second embodiment.

3.2.3 Operation

Figure 8:
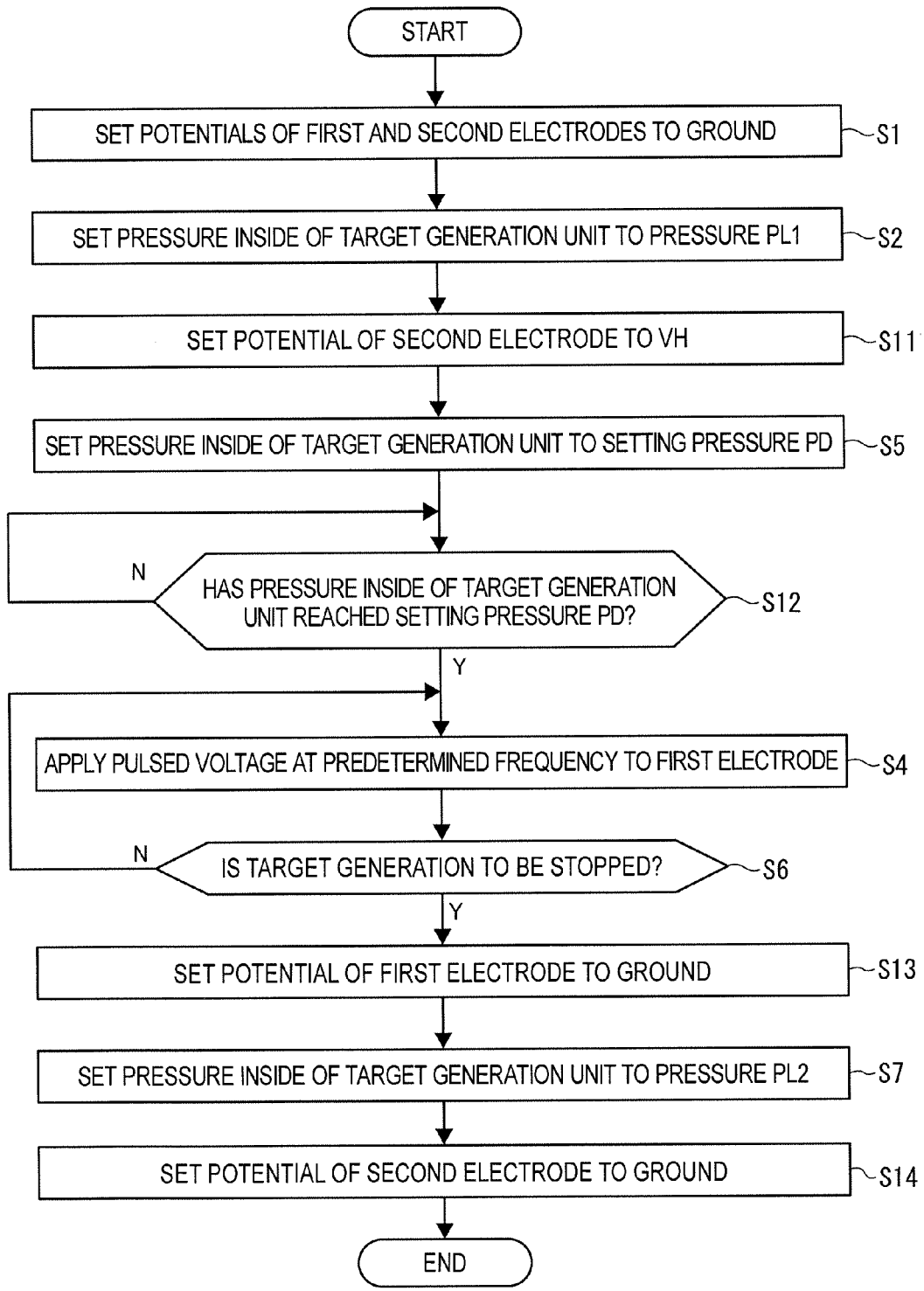
FIG. 8 is a flowchart illustrating a target supply method according to a second embodiment.
Figure 9:
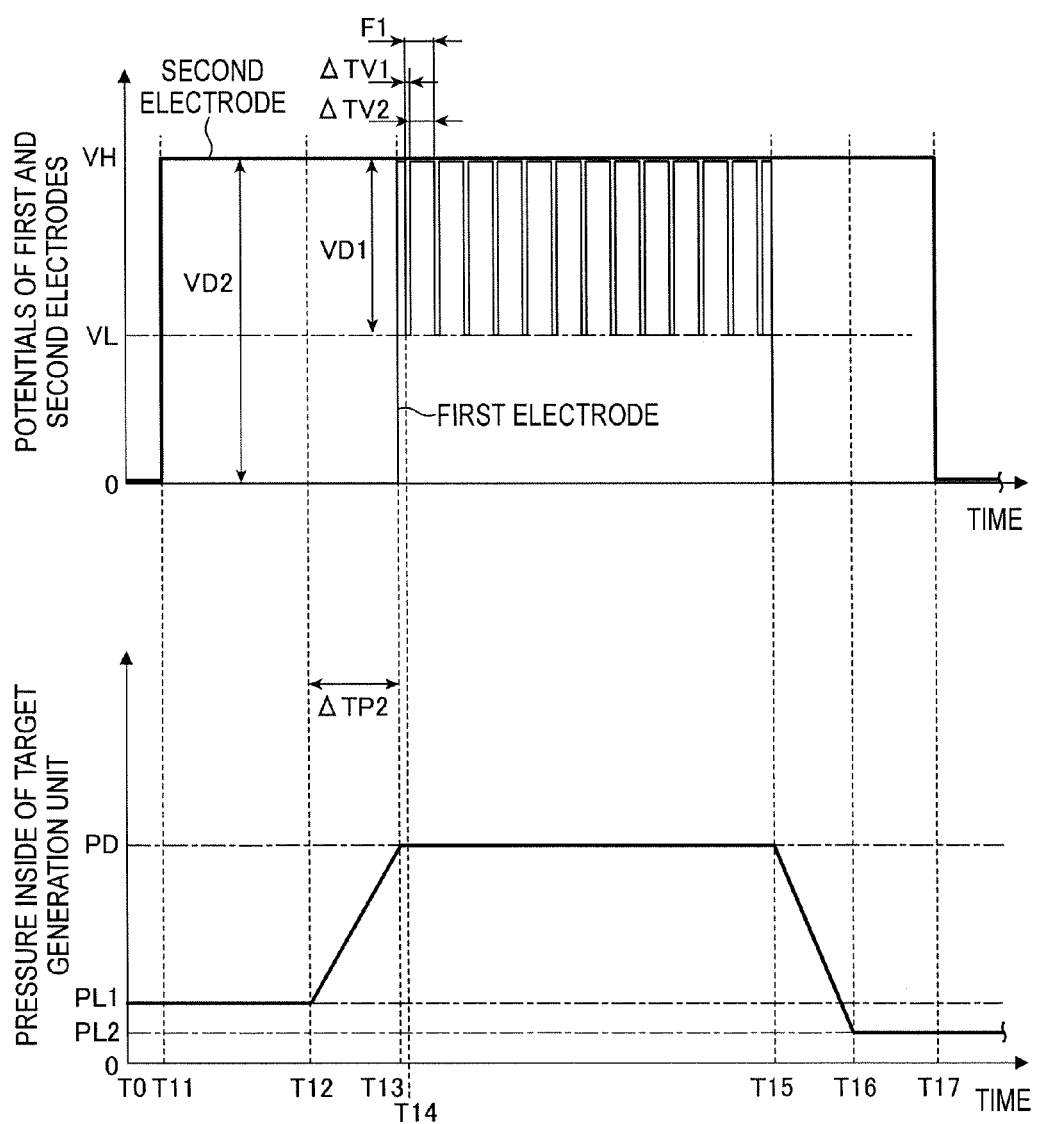
FIG. 9 is a timing chart illustrating the target supply method according to the second embodiment.

Hereinafter, description of the operation similar to that of the first embodiment will be omitted. FIG. 8 is a flowchart illustrating the target supply method according to the second embodiment. FIG. 9 is a timing chart illustrating the target supply method according to the second embodiment.

The pressure inside the target generation unit 71A may be at the atmospheric pressure.

As shown in FIG. 8, the target control unit 80B may carry out a process of step S1 and a process of step S2. With these processes, the respective potentials of the first electrode 751A and the second electrode 752A are grounded and the pressure inside the target generation unit 71A can become the pressure PL1 at time T0, as shown in FIG. 9.

At time T11, as shown in FIG. 8, the target control unit 80B may set the potential of the second electrode 752A to the potential VH (step S11). With the process of step S11, the potential of the second electrode 752A can rise up to the potential VH at time T11. Then, a potential difference VD2 (potential difference VD2=potential VH−0 (ground)) can be generated between the first electrode 751A and the second electrode 752A. The potential difference DV2 may be larger than the potential difference DV1. Note that the ground as a potential of the first electrode 751A may be the third potential of the present disclosure.

As shown in FIG. 8, the target control unit 80B may carry out a process of step 5 (process in which the pressure inside the target generation unit 71A is set to the setting pressure PD) at time T12. The target control unit 80B may determine whether or not the pressure inside the target generation unit 71A has reached the setting pressure PD (step S12). If it is determined in step S12 that the pressure has not reached the setting pressure PD yet, the target control unit 80B may carry out again the process of step S12 after a predetermined time has passed.

If it is determined in step S12 that the pressure has reached the setting pressure PD, the target control unit 80B may carry out a process of step 4 (process in which a pulsed voltage at a predetermined frequency is applied to the first electrode 751A).

Until the time when it is determined that the setting pressure PD has been reached in step S12, the pressure inside the target generation unit 71A gradually rises, as shown in FIG. 9, and can reach the setting pressure PD at time T13. Further, during a time ΔTP2 required for pressure rising (a period from time T12 to time T13), the potential difference VD2 can be generated between the first electrode 751A and the second electrode 752A.

This makes it possible to form the target 271A on the leading end of the projection 716A by the pressure inside the target generation unit 71A and to output the target 271A from the output portion 715A by the potential difference VD2.

Note that the potential difference DV2 can continue to be present during the time ΔTP2 required for pressure rising. With this, a process in which the above-mentioned target 271A is outputted from the output portion 715A by the potential difference DV2 after the target 271A of a predetermined size is formed on the leading end of the projection 716A is repeated.

With the process of step 4, a pulsed voltage with the cycle F1 whose maximum value is the potential VH and minimum value is the potential VL, can be applied to the first electrode 751A. When the potential of the first electrode 751A becomes the potential VL, the potential difference VD1 can be generated between the first electrode 751A and second electrode 752A. In this case, because the pressure inside the target generation unit 71A is at the setting pressure PD, the target 271A can be formed on the leading end of the projection 716A during the second time ΔTV2 in which both the potential of the first electrode 751A and the potential of the second electrode 752A are at the potential VH. Then, during the first time ΔTV1 in which the potential difference VD1 can be generated between the first electrode 751A and the second electrode 752A, the target 271A can be outputted.

The target control unit 80B may carry out a process of step 6, and if it is determined not to stop the generation of the target 271A, the target control unit 80B may carry out again the process of step S6 after a predetermine time has passed. Meanwhile, if it is determined to stop the generation of the target 271A in step S6, the target control unit 80B may set the potential of the first electrode 751A to the ground (step S13). The target control unit 80B may carry out a process of step S7 (process in which the pressure inside the target generation unit 71A is set to the pressure PL2). With the processes of steps S13 and S7, as shown in FIG. 9, the potential of the first electrode 751A can drop down to the ground at time T15 and the pressure inside the target generation unit 71A can drop down to the pressure PL2 at time T16.

After time T16 at which the pressure inside the target generation unit 71A has reached the pressure PL2, the generation of the target 271A can be stopped.

As shown in FIG. 8, the target control unit 80B may set the potential of the second electrode 752A to the ground (step S14) and may end the process. With the process of step S14, as shown in FIG. 9, the potentials of the first electrode 751A and second electrode 752A can be grounded after time T17.

As described above, in a state in which the pressure inside the target generation unit 71A is at the pressure PL1, the target control unit 80B of the target supply device 7B may apply the potential VH to the second electrode 752A. The target control unit 80B may set the potential of the first electrode 751A to the ground while applying the potential VH to the second electrode 752A. The target control unit 80B may raise the pressure inside the target generation unit 71A up to the setting pressure PD in a state in which the potential difference VD2 is generated between the first electrode 751A and second electrode 752A.

This makes it possible to generate the potential difference VD2 between the first electrode 751A and second electrode 752A during the time ΔTP2 required for pressure rising. The target supply device 7B can output the target 271A at least once during the time ΔTP2 required for pressure rising. Therefore, even if the set output direction 10A of the target 271A is slanted relative to the gravitational direction 10B, it is possible to prevent the target material 270 and the first electrode 751A from being short-circuited due to the target 271A adhering to the leading end of the projection 716A making contact with the first electrode 751A, at time T13 at which the pressure inside the target generation unit 71A has been raised to the setting pressure PD. Accordingly, the target supply device 7B can appropriately output the target 271A.

Note that in the second embodiment, the potential of the first electrode 751A is set to the ground during a period from time T11 to time 13. However, the potential thereof is not necessary needed to be the ground level as long as the potential is lower than the potential of the second electrode 752A. For example, the potential of the first electrode 751A may be the potential VL.

Further, in the second embodiment, the potential of the same magnitude VH is applied to the second electrode 752A both before and after time T14, that is, the first potential and the second potential have the same magnitude in the present disclosure. However, the second potential that is applied to the second electrode 752A before time T14 may not be the potential VH as long as the magnitude of the second potential is set so that a potential difference can be generated between the first electrode 751A and second electrode 752A before time T14.

3.3 Variation

The following configuration may be employed as a target supply device.

Figure 10A:
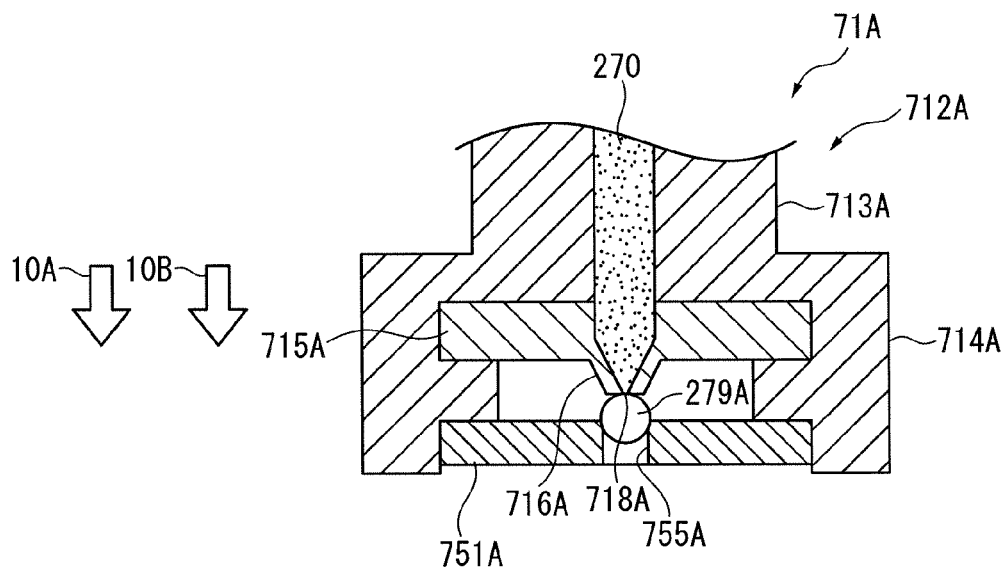
FIG. 10A is a diagram that schematically indicates a problem while illustrating a state in which a target makes contact with the first electrode.
Figure 10B:
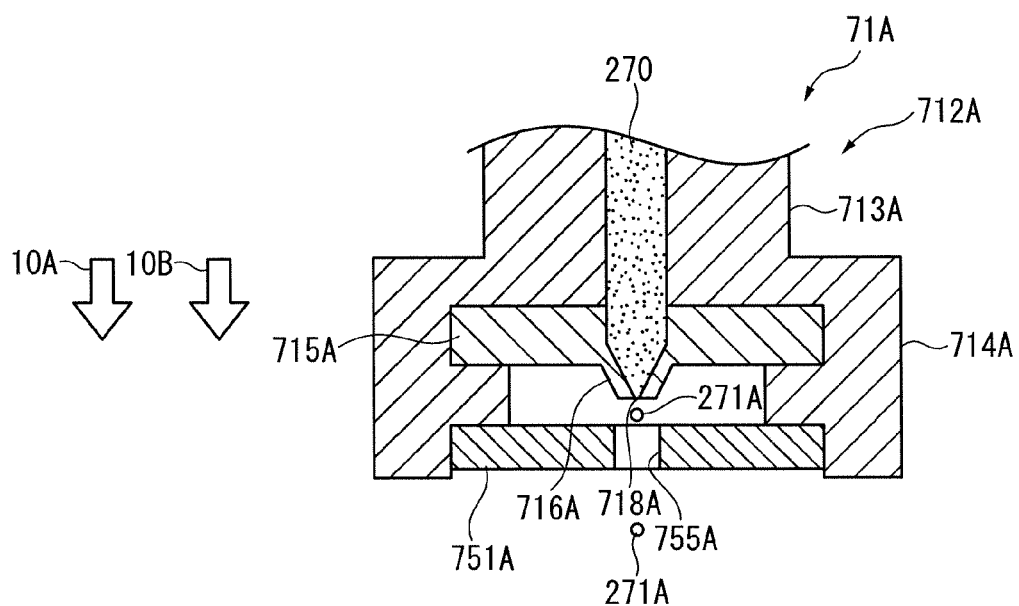
FIG. 10B is a diagram illustrating a state in which a target supply device according to a variation is in operation.

FIG. 10A is a diagram that schematically indicates a problem while illustrating a state in which a target makes contact with the first electrode. FIG. 10B is a diagram illustrating a state in which a target supply device according to a variation is in operation.

In the case where the set output direction 10A of the target 279A and the gravitational direction 10B are the same in direction, the target 279A can grow larger without being extracted as shown in FIG. 10A, depending on time length from time T92 to time T94 shown in FIG. 6. As a result, the target 279A makes contact with the first electrode 751A so that the target material 270 and the first electrode 751A can be short-circuited.

Alternately, in the case where the set output direction 10A and the gravitational direction 10B are the same in direction, employing the target supply method of the first or second embodiment makes it possible for the target supply device to output the target 271A before the target 271A grows large enough to make contact with the first electrode 751A, as shown in FIG. 10B.

The above-described embodiments and the modifications thereof are merely examples for implementing the present disclosure, and the present disclosure is not limited thereto. Making various modifications according to the specifications or the like is within the scope of the present disclosure, and other various embodiments are possible within the scope of the present disclosure. For example, the modifications illustrated for particular ones of the embodiments can be applied to other embodiments as well (including the other embodiments described herein).

The terms used in this specification and the appended claims should be interpreted as "non-limiting." For example, the terms "include" and "be included" should be interpreted as "including the stated elements but not limited to the stated elements." The term "have" should be interpreted as "having the stated elements but not limited to the stated elements." Further, the modifier "one (a/an)" should be interpreted as "at least one" or "one or more".

What is claimed is:

1. A target supply method using a target supply device that includes:
a target generation unit which has a nozzle and is configured to accommodate a target material in an interior of the target generation unit;
a pressure control unit which has a pressure sensor configured to detect a pressure inside the target generation unit and has an actuator configured to control the pressure inside the target generation unit;
an electrode configured to extract the target material through a nozzle hole of the nozzle with electrostatic force;
a potential application unit configured to apply a potential to the electrode and the target material inside the target generation unit; and
a timer, the target supply method comprising:
raising the pressure inside the target generation unit to a setting pressure by the actuator based on a detection result of the pressure inside the target generation unit detected by the pressure sensor;
applying different potentials to the electrode and the target material from each other by the potential application unit in the case where it is detected based on a time of the timer that the pressure inside the target generation unit is halfway raised to the setting pressure; and applying a constant first potential to the target material and a first pulse voltage to the electrode by the potential application unit in order to extract the target material with the electrostatic force in the case where it is detected based on the detection result by the pressure sensor that the pressure inside the target generation unit has been raised to the setting pressure.

2. The target supply method according to claim 1, wherein, if it is detected that the pressure inside the target generation unit is halfway raised to the to the setting pressure, applying of different potentials to the electrode and the target material from each other by the potential application unit is performed by the potential application applying a constant second potential which is the same as or different from the first potential to the target material and also applying a second pulse voltage which is the same as or different from the first pulse voltage to the electrode from time before raising of the pressure toward the setting pressure is started until time at which the pressure has been raised to the setting pressure.

3. The target supply method according to claim 1, wherein, if it is detected that the pressure inside the target generation unit is halfway raised to the setting pressure, applying of different potentials to the electrode and the target material from each other by the potential application unit is performed by the potential application unit applying a constant second potential which is the same as or different from the first potential to the target material and also applying a constant third potential which is lower than the second potential to the electrode from time before the raising of the pressure to the setting pressure is started until time when the pressure has been raised to the setting pressure.

4. A target supply device comprising:
a target generation unit that has a nozzle and is configured to accommodate a target material in the interior of the target generation unit;
a pressure control unit that has a pressure sensor configured to detect a pressure inside the target generation unit and has an actuator configured to control the pressure inside the target generation unit;

an electrode configured to extract the target material through a nozzle hole of the nozzle with electrostatic force;

a potential application unit configured to apply a potential to the electrode and the target material inside the target generation unit;

a timer; and a controlling unit configured to:

control the actuator such that the pressure inside the target generation unit is raised to a setting pressure based on a detection result of the pressure inside the target generation unit detected by the pressure sensor and a time of the timer;

control the potential application unit such that applying different potentials are applied to the electrode and the target material from each other in the case where it is detected that the pressure inside the target generation unit is halfway raised to the setting pressure based on the detection result of the pressure inside the target generation unit by the pressure sensor and the time of the timer; and control the potential application unit such that a constant first potential is applied to the target material and a first pulse voltage is applied to the electrode in order to extract the target material with the electrostatic force in the case where it is detected that the pressure inside the target generation unit has been raised to the setting pressure based on the detection result of the pressure inside the target generation unit detected by the pressure sensor and the time of the timer.

5. The target supply device according to claim 4, wherein, if it is detected that the pressure inside the target generation unit is halfway raised to the setting pressure, the controlling unit controls the potential application unit such that different potentials are applied to the electrode and the target material from each other through applying a constant second potential which is the same as or different from the first potential to the target material and also applying a second pulse voltage which is the same as or different from the first pulse voltage to the electrode in the case where the controlling unit detects that the raising of the pressure toward the setting pressure is before being started and that the pressure is before being raised up to the setting pressure based on the detection result of the pressure inside the target generation unit detected by the pressure sensor and the time of the timer.

6. The target supply device according to claim 4, wherein, if it is detected that the pressure inside the target generation unit is halfway raised to the setting pressure, the controlling unit controls the potential application unit such that different potentials are applied to the electrode and the target material from each other through applying a constant second potential which is the same as or different from the first potential to the target material and also applying a constant third potential which is lower than the second potential to the electrode in the case where the controlling unit detects that the raising of the pressure toward the setting pressure is before being started and that the pressure is before being raised up to the setting pressure based on the detection result of the pressure inside the target generation unit detected by the pressure sensor and the time of the timer.

* * * * *